United States Patent
Fukahori et al.

(10) Patent No.: US 10,716,212 B2
(45) Date of Patent: Jul. 14, 2020

(54) LC DEVICE AND METHOD OF MANUFACTURING LC DEVICE

(71) Applicant: Murata Manufacturing Co., Ltd., Nagaokakyo-shi, Kyoto-fu (JP)

(72) Inventors: Souko Fukahori, Nagaokakyo (JP); Toshiyuki Nakaiso, Nagaokakyo (JP); Akinori Hamada, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 7 days.

(21) Appl. No.: 16/351,716

(22) Filed: Mar. 13, 2019

(65) Prior Publication Data

US 2019/0215962 A1    Jul. 11, 2019

Related U.S. Application Data

(63) Continuation of application No. PCT/JP2017/036730, filed on Oct. 11, 2017.

(30) Foreign Application Priority Data

Dec. 12, 2016    (JP) .................................. 2016-240309

(51) Int. Cl.
*H05K 1/16* (2006.01)
*H01F 17/04* (2006.01)
(Continued)

(52) U.S. Cl.
CPC ........... *H05K 1/16* (2013.01); *H01F 17/0013* (2013.01); *H01F 17/04* (2013.01); *H01F 27/292* (2013.01);
(Continued)

(58) Field of Classification Search
None
See application file for complete search history.

(56) References Cited

U.S. PATENT DOCUMENTS 5,604,383 A    2/1997    Matsuzaki
2015/0310994 A1    10/2015    Yosui
(Continued)

FOREIGN PATENT DOCUMENTS

JP    H0595031 U    12/1993
JP    H07302738 A    11/1995
(Continued)

OTHER PUBLICATIONS

International Search Report issued for PCT/JP2017/036730, dated Jan. 16, 2018.
(Continued)

*Primary Examiner* — Reema Patel
(74) *Attorney, Agent, or Firm* — Arent Fox LLP

(57) ABSTRACT

An inductor having an excellent Q values is provided with a configuration in which an inductor and a capacitor are integrally formed in a single element. Specifically, an LC device is provided that includes an element, an inductor, a capacitor, and a magnetic body portion. The element has a planar shape, and includes an insulating resin layer at at least part of the element. The inductor includes a loop-shaped conductor pattern and is formed inside the element. The capacitor is a mounting-type element, and is disposed in an opening of the loop-shaped conductor pattern and inside the element with at least a mounting surface of the capacitor being in contact with the resin layer. The magnetic body portion forms part of the element and is disposed between the conductor pattern and the capacitor over substantially an entire length of the loop-shaped conductor pattern.

20 Claims, 11 Drawing Sheets

(51) Int. Cl.
*H05K 1/18* (2006.01)
*H05K 1/02* (2006.01)
*H05K 3/46* (2006.01)
*H01F 27/29* (2006.01)
*H01F 17/00* (2006.01)

(52) U.S. Cl.
CPC .......... *H05K 1/0298* (2013.01); *H05K 1/185* (2013.01); *H05K 3/46* (2013.01); *H05K 3/4632* (2013.01); *H01F 2017/008* (2013.01); *H01F 2017/0026* (2013.01); *H05K 2201/10015* (2013.01)

(56) References Cited

U.S. PATENT DOCUMENTS

| | | |
|---|---|---|
| 2016/0093434 A1 | 3/2016 | Hamada |
| 2017/0042033 A1 | 2/2017 | Nishino |

FOREIGN PATENT DOCUMENTS

| | | | |
|---|---|---|---|
| JP | H07307440 A | 11/1995 | |
| JP | 2000031772 A | 1/2000 | |
| JP | 2007288104 A | 11/2007 | |
| JP | 2009212255 A | 9/2009 | |
| JP | 2011124373 A | 6/2011 | |
| JP | 2016072407 A | 5/2016 | |
| WO | 2014115434 A1 | 7/2014 | |
| WO | 2015194373 A1 | 12/2015 | |

OTHER PUBLICATIONS

Written Opinion of the International Searching Authority issued for PCT/JP2017/036730, dated Jan. 16, 2018.

LC DEVICE AND METHOD OF MANUFACTURING LC DEVICE

CROSS REFERENCE TO RELATED APPLICATIONS

The present application is a continuation of PCT/JP2017/036730 filed Oct. 11, 2017, which claims priority to Japanese Patent Application No. 2016-240309, Dec. 12, 2016, the entire contents of each of which are incorporated herein by reference.

TECHNICAL FIELD

The present disclosure relates to an LC device in which an inductor and a capacitor are integrally formed in a single element, and to a method of manufacturing the LC device.

BACKGROUND

Currently, various small and thin LC devices suitable for, for example, portable communication terminals have been proposed. For example, Patent Documents 1 and 2 (identified below) describe one in which, by using a thin-film process, an inductor and a capacitor are formed, and these are integrally formed in a single element.

Patent Document 3 (identified below) describes one including an inductor and a capacitor inside a multilayer board. In the LC device described in Patent Document 3, the inductor is realized by a conductor pattern formed inside the multilayer board, and the capacitor is a mounting-type capacitor built in the multi-layer board.

Patent Document 1: Japanese Unexamined Patent Application Publication No. 7-307440.
Patent Document 2: Japanese Unexamined Patent Application Publication No. 2007-288104.
Patent Document 3: International Publication No. 2015-194373.

However, when the thin-film process is used as described in Patent Documents 1 and 2, the direct-current resistance of the inductor is increased, this inductor is not suitable to be used for large current applications, and the Q value is reduced.

In addition, since, in the structure described in Patent Document 3, the capacitor is disposed in an opening of the spiral-shaped inductor and the whole of these is covered by an insulating resin, the magnetic field that is generated at the inductor acts on the capacitor, thereby resulting in inductor loss. This reduces the Q value of the inductor.

SUMMARY OF THE INVENTION

Accordingly, it is an object of the present disclosure to provide an inductor having an excellent Q value in a configuration in which an inductor and a capacitor are integrally formed in a single element.

Thus, an LC device according to an exemplary embodiment includes an element, an inductor, a capacitor, and a first magnetic-body. The element has a planar shape, a first principal surface and a second principal surface facing each other, and includes an insulating resin layer at at least part of the element. The inductor includes a loop-shaped conductor pattern disposed inside the element and in plan view from the first principal surface. The capacitor is an LGA ("land grid array") type element, and is disposed in an opening of the loop-shaped conductor pattern in the plan view and inside the element with at least a mounting surface of the capacitor being in contact with the resin layer. The first magnetic-body forms part of the element and is disposed between the loop-shaped conductor pattern and the mounting-type capacitor over substantially an entire length of the loop-shaped conductor pattern.

In this structure, the magnetic field that is generated by the loop-shaped conductor pattern passes through the first magnetic-body portion to suppress capacitor loss.

In addition, in an exemplary aspect, the LC device includes a second magnetic-body at at least part of the loop-shaped conductor pattern on a side opposite to the first magnetic-body with the loop-shaped conductor pattern being a reference.

In this structure, loss on the outer side of the loop-shaped conductor pattern caused by the magnetic field that is generated by the loop-shaped conductor pattern is suppressed.

In addition, in an exemplary aspect of the LC device, the second magnetic-body is disposed facing the first magnetic-body over substantially the entire length of the loop-shaped conductor pattern.

In this structure, loss on the outer side of the loop-shaped conductor pattern caused by the magnetic field that is generated by the loop-shaped conductor pattern is further suppressed.

In addition, in an exemplary aspect, the LC device includes at least one of a third magnetic-body disposed on a side of the first principal surface of the loop-shaped conductor pattern and a fourth magnetic-body disposed on a side of the second principal surface of the loop-shaped conductor pattern.

In this structure, loss on at least one of the first principal surface side and the second principal surface side of the loop-shaped conductor pattern caused by the magnetic field that is generated by the loop-shaped conductor pattern is suppressed.

In addition, in an exemplary aspect, the LC device includes both of the third magnetic-body and the fourth magnetic-body, wherein the first magnetic-body, the second magnetic-body, the third magnetic-body, and the fourth magnetic-body are connected to each other in a shape that surrounds the loop-shaped conductor pattern.

In this structure, since the magnetic field that is generated by the loop-shaped conductor pattern passes through a closed magnetic circuit formed by the first magnetic-body, the second magnetic-body, the third magnetic-body, and the fourth magnetic-body, loss is further suppressed.

In addition, in an exemplary aspect, the first magnetic-body, the second magnetic-body, the third magnetic-body, and the fourth magnetic-body are made of a metal composite material.

In this structure, the DC superimposition characteristics of the inductor are improved.

In addition, in an exemplary aspect the LC device, the capacitor includes a first external terminal conductor and a second external terminal conductor. A first input/output terminal conductor, a second input/output terminal conductor, and a ground terminal conductor are formed on the first principal surface of the element. The first input/output terminal conductor is connected to one end of the inductor. The other end of the inductor is connected to the second input/output terminal conductor and the first external terminal conductor of the capacitor. The second external terminal conductor of the capacitor is connected to the ground terminal conductor.

In this structure, an LC device in which the inductor is connected in series with a signal line and the capacitor is connected to a shunt is formed.

In addition, in an exemplary aspect, it is desirable that a width of a wiring conductor that connects the other end of the inductor and the first external terminal conductor is larger than a width of the loop-shaped conductor pattern that forms the inductor.

In this structure, ESL of a path that connects the signal line to ground via the capacitor is suppressed.

In addition, in an exemplary aspect of the LC device, the second external terminal conductor is formed on a side of the first principal surface of a body of the capacitor. The second external terminal conductor and the ground terminal conductor at least partly overlap each other in the plan view, and are only connected to each other by a conductor extending in a thickness direction of the element.

In this structure, ESL of a path that connects the signal line to ground via the capacitor is further suppressed.

In addition, a method of manufacturing an LC device is disclosed that includes forming a magnetic-path-formation sacrificial layer, which is made of a same material as the conductor pattern, and a resin layer onto a surface of a base board; and providing a recessed portion in the resin layer and disposing the capacitor. The method of manufacturing an LC device includes removing the magnetic-path-formation sacrificial layer excluding a portion covered by the resin layer, and forming a hole for the first magnetic-body portion; and filling the hole with a magnetic-body material.

In this exemplary manufacturing method, it is possible to provide the conductor pattern of the LC device having the above-described structure and prepare for the formation of a hole for the magnetic body portion at the same time, so that the process is simplified.

In the configuration in which the inductor and the capacitor are integrally formed in a single element, an inductor is provided that has an excellent Q value.

DETAILED DESCRIPTION OF EXEMPLARY EMBODIMENTS

Figure 1A:
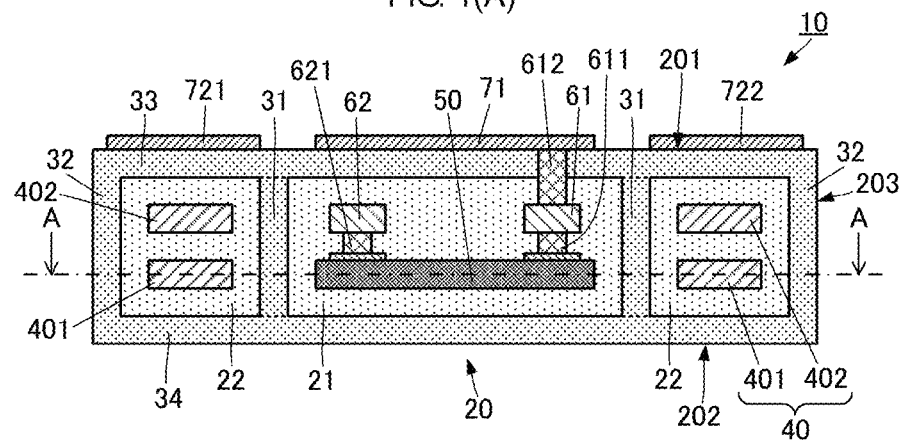
FIG. 1(A) is a structural view showing a configuration of an LC device according to a first exemplary embodiment as viewed from a side surface thereof.
Figure 1B:
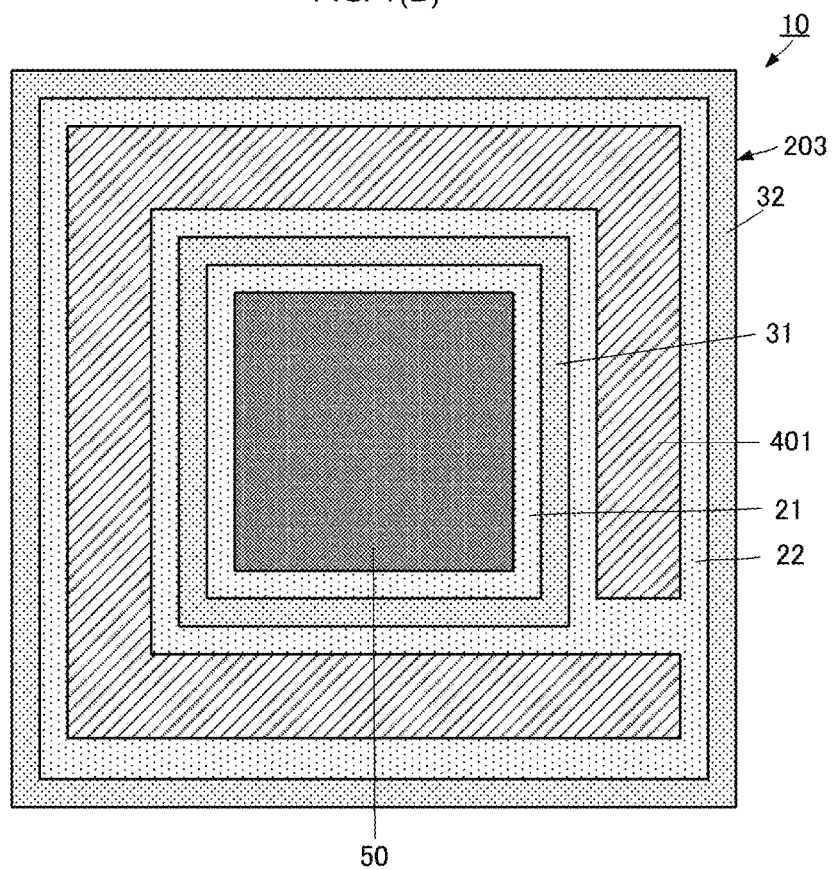
FIG. 1(B) is a sectional plan view showing the structure of the LC device according to the first exemplary embodiment.

An LC device according to a first embodiment is described with reference to the drawings. FIG. 1(A) is a structural view showing a configuration of the LC device according to the first embodiment as viewed from a side surface thereof. FIG. 1(B) is a sectional plan view showing the structure of the LC device according to the first embodiment.

As shown in FIGS. 1(A) and 1(B), the LC device 10 includes an element 20, magnetic body portions 31, 32, 33, and 34 (i.e., magnetic bodies), an inductor 40, a capacitor 50, wiring conductors 61 and 62, a ground terminal conductor 71, and input/output terminal conductors 721 and 722.

The element 20 has a first principal surface 201 and a second principal surface 202 that face each other. In addition, the element 20 has a side surface 203 that connects the first principal surface 201 and the second principal surface 202. The element 20 has a rectangular shape in plan view from the first principal surface 201. The element 20 includes resin portions 21 and 22 and the magnetic body portions 31, 32, 33, and 34. The resin portions 21 and 22 are made of an insulating resin material. The magnetic body portions 31, 32, 33, and 34 are made of a metal composite material formed by compacting a metal magnetic powder. That is, the magnetic body portions 31, 32, 33, and 34 are made of a material in which metal particles (metal magnetic powder) is mixed with an insulating resin material. It is noted that, when metal particles to whose surfaces inorganic insulating films have been attached are used, the metal composite material need not include a resin material. The metal particles are disposed so as to be scattered substantially uniformly inside the resin material. The magnetic body portions 31, 32, 33, and 34 substantially have insulating properties, and macroscopically have insulating properties. Moreover, the metal particles can be made of, for example, an Ni—Fe alloy according to an exemplary aspect.

The resin portion 21 is rectangular in the plan view from the first principal surface 201, and has a rectangular parallelepiped shape. The resin portion 21 is provided between the magnetic body portion 31 and the chip-type capacitor 50 in the plan view, that is, the resin portion 21 is provided to surround the entire periphery of the capacitor 50, such that the magnetic body portion 31 and the capacitor 50 do not directly contact each other. It is noted that, although, similarly to the resin portion 22, the resin portion 21 is basically formed from a nonmagnetic insulating body (a resin layer that does not include magnetic particles), the resin portion 21 may be a low-permeability magnetic body having a magnetic permeability that is lower than that of each magnetic body portion. That is, each resin portion may include magnetic particles by a quantity that is smaller than the quantity of magnetic particles contained in each magnetic body portion.

In the plan view, the magnetic body portion 31 is provided along an inner periphery of the coiled inductor 40 around an outer periphery of the capacitor 50 such that the inductor 40 and the capacitor 50 do not directly contact each other, and covers the entire side surface of the resin portion 21. The magnetic body portion 31 corresponds to a "first magnetic-body portion" of the present disclosure.

The resin portion 22 is provided along the inner and outer peripheries of the coiled inductor 40 and between wires of loop-shaped conductors that make up the inductor 40. The resin portion 22 covers the entire side surface of the magnetic body portion 31 on a side opposite to a side surface of the magnetic body portion 31 that contacts the resin portion 21.

In the plan view, the magnetic body portion 32 is provided along the outer periphery of the coiled inductor 40 so as not to directly contact the inductor 40, and covers the entire side surface of the resin portion 22 on a side opposite to a side surface of the resin portion 22 that contacts the magnetic body portion 31. A side surface of the magnetic body portion 32 on a side opposite to a side surface of the magnetic body portion 32 that contacts the resin portion 22 is the side surface 203 of the element 20. The magnetic body portion 32 corresponds to a "second magnetic-body portion" of the present disclosure.

The magnetic body portion 33 covers the entire first-principal-surface-201-side surface of a portion made up of the resin portion 21, the magnetic body portion 31, the resin portion 22, and the magnetic body portion 32. A surface of the magnetic body portion 33 on a side opposite to a surface of the magnetic body portion 33 that contacts the portion made up of the resin portion 21, the magnetic body portion 31, the resin portion 22, and the magnetic body portion 32 is the first principal surface 201 of the element 20.

The magnetic body portion 34 covers the entire second-principal-surface-202-side surface of a portion made up of the resin portion 21, the magnetic body portion 31, the resin portion 22, and the magnetic body portion 32. A surface of the magnetic body portion 34 on a side opposite to a surface of the magnetic body portion 34 that contacts the portion made up of the resin portion 21, the magnetic body portion 31, the resin portion 22, and the magnetic body portion 32 is the second principal surface 202 of the element 20.

It is to be noted that clear interfaces do not exist between the magnetic body portions 31, 32, 33, and 34. The magnetic body portions 31, 32, 33, and 34 are magnetic body portions that are integrally formed.

The inductor 40 includes conductor patterns 401 and 402. As shown in FIG. 1(B), in the plan view from the first principal surface 201, the conductor pattern 401 has a loop shape including an opening. Similarly to the conductor pattern 401, in the plan view from the first principal surface 201, the conductor pattern 402 also has a loop shape including an opening. In the plan view from the first principal surface 201, the conductor pattern 401 and the conductor pattern 402 overlap each other over substantially the entire length.

The conductor pattern 401 and the conductor pattern 402 are connected to each other by a conductor pattern (not shown). By these conductor patterns, the inductor 40 has a spiral shape having an opening in the plan view from the first principal surface 201 and including an axis parallel to a thickness direction of the element 20.

The conductor patterns 401 and 402 are formed inside the resin portion 22. In other words, the inductor 40 is disposed inside the resin portion 22.

The capacitor 50 is a mounting-type device, and is a thin-film capacitor device including a so-called LGA-type terminal conductor and formed by a thin-film process. The capacitor 50 includes a planar body portion that generates capacitance, and a first external terminal conductor and a second external terminal conductor, which are formed on a principal surface (mounting surface) of the body portion. It is noted that one or a plurality of the first external terminal conductors and one or a plurality of the second external terminal conductors may be used.

According to the exemplary embodiment, the capacitor 50 is disposed inside the resin portion 21. The capacitor 50 is disposed such that the mounting surface is on the side of the first principal surface 201. In the thickness direction of the element 20, the position of the capacitor 50 and the position of the conductor pattern 401 of the inductor 40 substantially correspond with each other. In other words, the capacitor 50 and the conductor pattern 401 are disposed in the same layer of the element 20. Here, by causing the thickness of the capacitor 50 to be substantially the same as the thickness of the conductor pattern 401, the element 20 and, thus, the LC device 10 can be made thin.

Moreover, the wiring conductors 61 and 62 are disposed inside the resin portion 21. By a conductor pattern 611 including a so-called via conductor, the wiring conductor 61 is connected to the second external terminal conductor of the capacitor 50. By a conductor pattern 621 including a so-called via conductor, the wiring conductor 62 is connected to the first external terminal conductor of the capacitor 50.

The ground terminal conductor 71 and the input/output terminal conductors 721 and 722 each have a rectangular shape, and are formed on the first principal surface 201 of the element 20. In the plan view from the first principal surface 201, the ground terminal conductor 71 overlaps the wiring conductor 61 and the second external terminal conductor of the capacitor 50. By a conductor pattern 612 including a so-called via conductor, the ground terminal conductor 71 is connected to the wiring conductor 61. The input/output terminal conductor 721 and the input/output terminal conductor 722 are disposed on respective sides of the ground terminal conductor 71.

Figure 2:
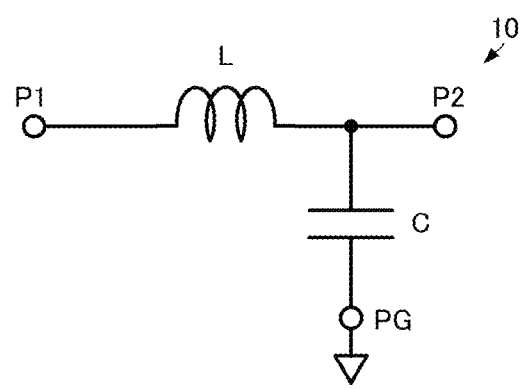
FIG. 2 is an equivalent circuit diagram of the LC device according to the first exemplary embodiment.

According to the structure of the exemplary embodiment, the LC device 10 provides a circuit shown in FIG. 2. FIG. 2 is an equivalent circuit diagram of the LC device according to the first embodiment.

As shown in FIG. 2, the LC device 10 includes, in terms of a circuit, input/output terminals P1 and P2, a ground terminal PG, an inductor L, and a capacitor C. One end of the inductor L is connected to the input/output terminal P1, and the other end of the inductor L is connected to the input/output terminal P2. That is, the inductor L is connected in series with a signal line that connects the input/output terminals P1 and P2. One end of the capacitor C is connected to a signal line that connects the other end of the inductor L and the input/output terminal P2, and the other end of the capacitor is connected to a ground terminal PG The ground terminal PG is connected to, for example, a reference potential or ground. The input/output terminals P1 and P2 are realized by the respective input/output terminal conductors 721 and 722; and the ground terminal PG is realized by the ground terminal conductor 71. The inductor L is realized by the inductor 40, and the capacitor C is realized by the capacitor 50.

Due to the above-described configuration, in the LC device 10, the magnetic body portion 31 is disposed between the loop-shaped conductor patterns 401 and 402 and the capacitor 50. In addition, over the entire length in a direction of extension of the loop-shaped conductor patterns 401 and 402, the magnetic body portion 31 is disposed between the loop-shaped conductor patterns 401 and 402 and the capacitor 50. Therefore, a magnetic field that is generated from the loop-shaped conductor patterns 401 and 402 due to electric current flowing through the inductor 40 and that acts towards the side of the center of the element 20 passes inside the magnetic body portion 31. Consequently, linkage of the magnetic field with the capacitor 50 is suppressed, and loss caused by eddy current that is generated at the capacitor 50 is also suppressed. This causes a reduction in the Q value of the inductor 40 to be suppressed. By suppressing the generation of eddy current at the capacitor 50, a rise in temperature of the capacitor 50 can be suppressed and a reduction in the characteristics of the capacitor 50 can also be suppressed.

Further, the magnetic body portion 32 is disposed on the side of the side surface 203 of the element 20 with respect to the loop-shaped conductor patterns 401 and 402. In addition, the magnetic body portion 32 is disposed over the entire length in the direction of extension of the loop-shaped conductor patterns 401 and 402. Therefore, a magnetic field that is generated from the loop-shaped conductor patterns 401 and 402 due to electric current flowing through the inductor 40 and that acts towards the side of the side surface 203 of the element 20 passes inside the magnetic body portion 32. Consequently, it is possible to suppress the occurrence of loss caused by, for example, an external device when the magnetic field leaks to the outside of the element 20. This causes a reduction in the Q value of the inductor 40 to be further suppressed.

Further, with respect to the loop-shaped conductor patterns 401 and 402, the magnetic body portion 33 is disposed on the first-principal-surface-201 side of the element 20 and the magnetic body portion 34 is disposed on the second-principal-surface-202 side of the element 20. In addition, the magnetic body portions 33 and 34 are disposed over the entire length in the direction of extension of the loop-shaped conductor patterns 401 and 402. Further, the magnetic body portions 33 and 34 are connected to the magnetic body portions 31 and 32. Therefore, the magnetic field that is generated from the loop-shaped conductor patterns 401 and 402 due to the electric current flowing through the inductor 40 passes through a closed magnetic path formed by the magnetic body portions 31, 32, 33, and 34. Consequently, it is possible to suppress loss caused by linkage of the magnetic field with conductor patterns of other devices. This causes a reduction in the Q value of the inductor 40 to be further suppressed.

According to this configuration, when the LC device 10 has the above-described structure, it is possible to provide an inductor having an excellent Q value.

In the LC device 10, although the magnetic body portion 31 has a shape that is formed continuously along the thickness direction of the element 20, the magnetic body portion 31 may have a partly discontinuous portion. However, when the magnetic body portion 31 has a shape that is formed continuously along the thickness direction of the element 20, if conductor patterns are disposed in the thickness direction of the element 20 as are the loop-shaped conductor patterns 401 and 402, a portion where the magnetic field leaks to the side of the capacitor 50 does not exist in the thickness direction. Therefore, it is possible to further reliably suppress the above-described loss and to further reliably suppress a reduction in the Q value.

According to the exemplary embodiment of the LC device 10, the capacitor 50 is also covered by the magnetic body portions 31, 33, and 34. Therefore, it is possible to suppress the leakage of electromagnetic noise that is generated from the capacitor 50 to the inductor 40 or to the outside. Here, one of the principal surfaces of the capacitor 50 on the side of the first external terminal conductor and the second external terminal conductor and a region in which the wiring conductors 61 and 62 and the conductor patterns 611 and 621 are formed are covered by the resin portion 21. Therefore, even if the magnetic body portions 31 and 33 include a conductive material (such as the above-described metal particles), it is possible to suppress a short circuit. Further, even if an inductor having a plurality of turns at narrow intervals of, for example, 2 to 30 μm for increasing the inductance is formed, the probability of a short circuit between each turn is very low. Therefore, it is possible to increase the range of selection of the materials of the magnetic body portions 31 and 33, and to, in particular, increase the quantity of metal particles in the magnetic body portions to 90 wt % or more.

In the LC device 10, the second external terminal conductor of the capacitor 50 overlaps the ground terminal conductor 71; and by only the wiring conductor 61 and the conductor patterns 611 and 612, that is, by only the conductors extending in the thickness direction of the element 20, the second external terminal conductor is connected to the ground terminal conductor 71. Therefore, it is possible suppress parasitic inductance that is generated between the capacitor C and the ground terminal PG shown in FIG. 2. That is, it is possible to suppress ESL of a path that connects the signal line and the ground terminal PG by the capacitor C.

In the LC device 10, since the magnetic body portion 31 is not disposed between the conductor patterns 401 and 402 and the insulating resin portion 22 is disposed between the conductor patterns 401 and 402, even if the magnetic body portion 31 is made of a metal composite material and the distance between the conductor patterns 401 and 402 is small, it is possible to suppress a short circuit between the conductor patterns 401 and 402.

The LC device 10 having such a structure is manufactured by the following manufacturing method. FIG. 3(A) to FIG. 3(F), FIG. 4(A) to FIG. 4(E), FIG. 5(A) to FIG. 5(D), FIG. 6(A) to FIG. 6(D), and FIG. 7(A) to FIG. 7(C) are each a side sectional view showing a structure in a manufacturing step of the LC device according to the embodiment.

Figure 3A:
FIGS. 3(A) to 3(F) are each a side sectional view showing a structure in a manufacturing step of the LC device according to an exemplary embodiment.

As shown in FIG. 3(A), a base board 901 is prepared. The base board 901 is, for example, an FR-4 board. Peeling layers are formed on both principal surfaces of the base board 901.

Figure 3B:
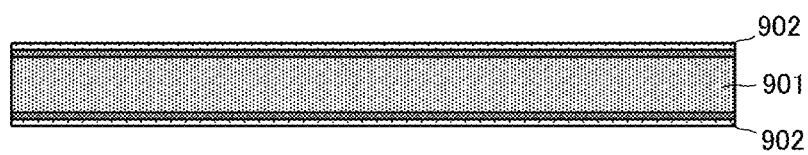

As shown in FIG. 3(B), base resin layers 902 are formed on both principal surfaces of the base board 901. For the base resin layers 902, the materials of the above-described resin portions 21 and 22 are used.

Figure 3C:
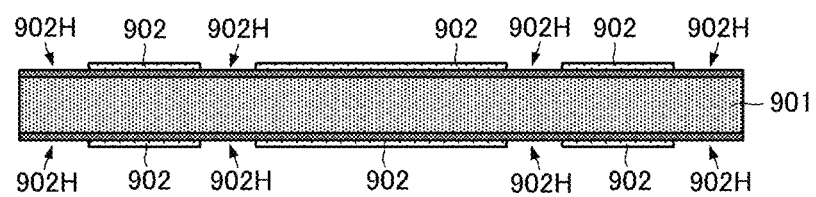

As shown in FIG. 3(C), pattern etching is performed on each base resin layer 902 to form magnetic-path-formation through holes 902H.

Figure 3D:
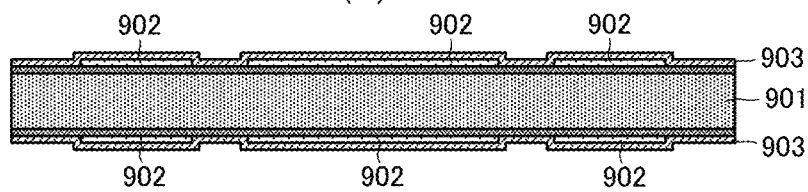

As shown in FIG. 3(D), seed layers 903 are formed to cover the corresponding base resin layers 902 and surfaces of the base board 901 exposed by the magnetic-path-formation through holes 902H. The seed layers 903 are made of the same material as the above-described coiled conductor pattern 401.

Figure 3E:
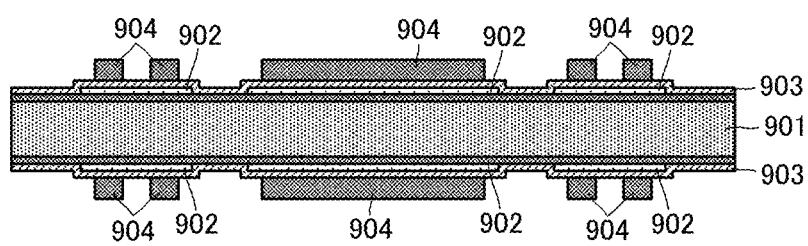

As shown in FIG. 3(E), each resist pattern 904 is formed on a corresponding region where the base resin layer 902 and the seed layer 903 are laminated to each other.

Figure 3F:
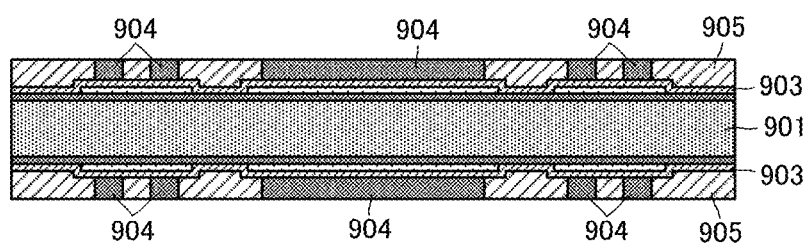

As shown in FIG. 3(F), each magnetic-path-formation sacrificial layer 905 is formed on a resist-pattern-904 non-formation region of a surface of the corresponding seed layer 903. The magnetic-path-formation sacrificial layers 905 are made of the same material as the above-described conductor pattern 401.

Figure 4A:
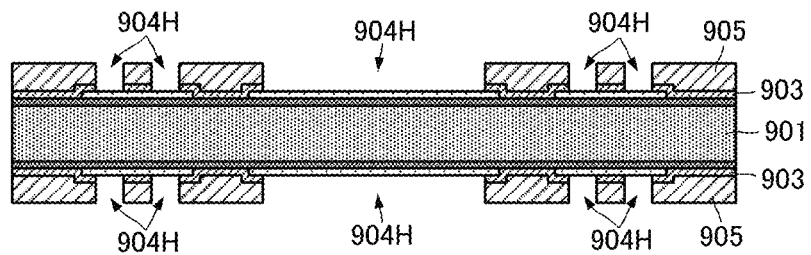
FIGS. 4(A) to 4(E) are each a side sectional view showing a structure in a manufacturing step of the LC device according to an exemplary embodiment.

As shown in FIG. 4(A), recessed portions 904H are formed by removing the resist patterns 904 and portions of the seed layers 903 at positions that overlap the corresponding resist patterns 904.

Figure 4B:
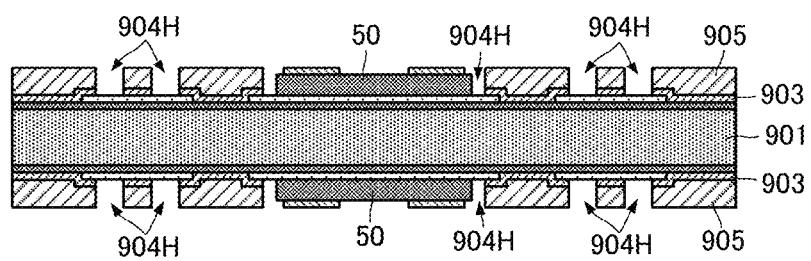

As shown in FIG. 4(B), capacitors 50 are formed inside the corresponding center recessed portions 904H. Here, the capacitors 50 are each disposed such that a surface thereof on a side opposite to the surface where the first external terminal conductor and the second external terminal conductor are formed contact the corresponding base resin layer 902.

Figure 4C:
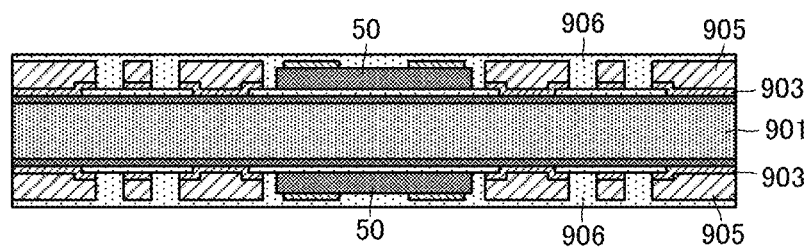

As shown in FIG. 4(C), each resin layer 906 is formed so as to cover the corresponding the magnetic-path-formation sacrificial layer 905 and to fill the corresponding recessed portion 904H.

Figure 4D:
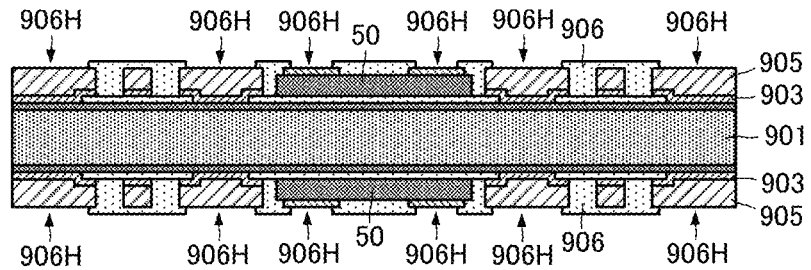

As shown in FIG. 4(D), recessed portions 906H are formed by pattern etching the resin layers 906. Here, the recessed portions 906H are formed such that the surface of each magnetic-path-formation sacrificial layer 905 excluding portions that become the coiled conductor pattern 401 is exposed, and such that the first external terminal conductor and the second external terminal conductor of the capacitor 50 are exposed.

Figure 4E:
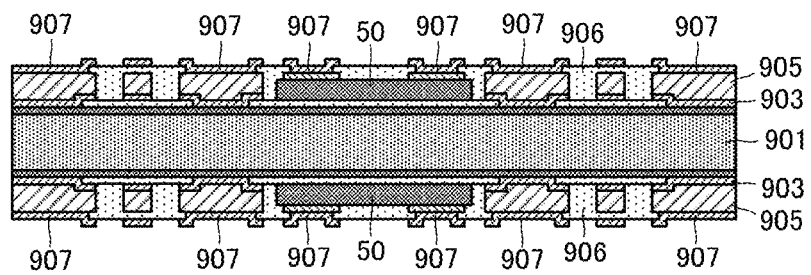

As shown in FIG. 4(E), each seed layer 907 is formed on a surface of the corresponding resin layer 906 that, in plan view, overlaps the portion of the magnetic-path-formation sacrificial layer 905, which becomes the coiled conductor pattern 401, so as to cover the corresponding recessed portion 906H. Each seed layer 907 is formed on a portion where the corresponding magnetic-path-formation sacrificial layer 905 is exposed by the corresponding recessed portion 906H and on portions that become the above-described conductor patterns 402, 611, and 612 and the wiring conductors 61 and 62.

Figure 5A:
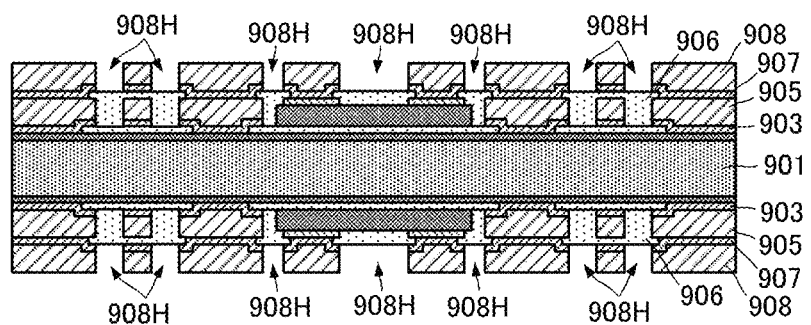
FIGS. 5(A) to 5(D) are each a side sectional view showing a structure in a manufacturing step of the LC device according to an exemplary embodiment.

As shown in FIG. 5(A), each magnetic-path-formation sacrificial layer 908 is formed on a surface of the corresponding seed layer 907. The seed layers 907 and the magnetic-path-formation sacrificial layers 908 are made of the same material as the conductor patterns 402, 611, and 612 and the wiring conductors 61 and 62. Here, recessed portions 908H are formed at portions where the seed layers 907 do not exist.

Figure 5B:
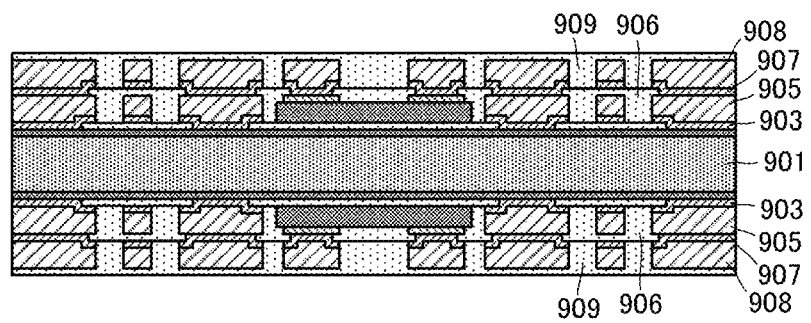

As shown in FIG. 5(B), resin layers 909 are formed so as to cover the corresponding magnetic-path-formation sacrificial layers 908 and to fill the corresponding recessed portions 908H.

Figure 5C:
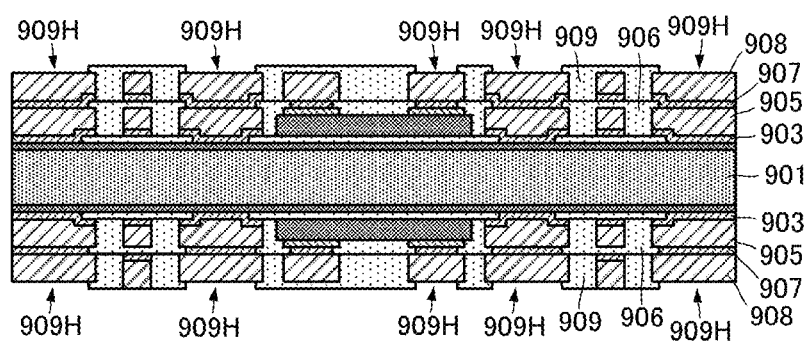

As shown in FIG. 5(C), recessed portions 909H are formed by pattern etching the corresponding resin layers 909. Here, each recessed portion 909H is formed so as to expose a surface of the corresponding magnetic-path-formation sacrificial layer 908 excluding the portions that become the coiled conductor pattern 402 and the wiring conductor 62.

Figure 5D:
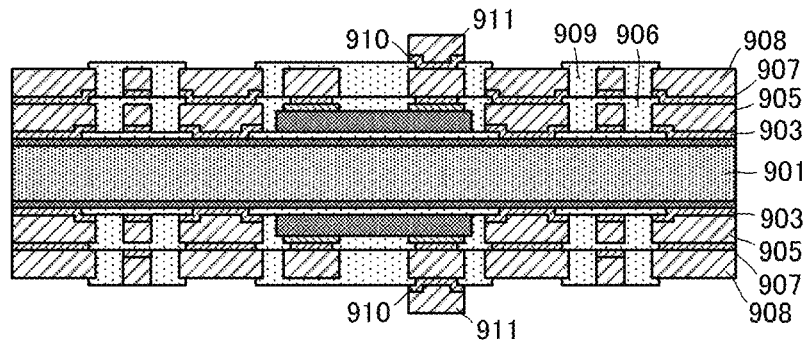

As shown in FIG. 5(D), each seed layer 910 is formed so as to cover a portion overlapping a portion that becomes the wiring conductor 61 in the corresponding recessed portion 906H. Then, each conductor layer 911 is formed on a surface of the corresponding seed layer 910. The seed layers 910 and the conductor layers 911 are made of the same material as the conductor pattern 612.

Figure 6A:
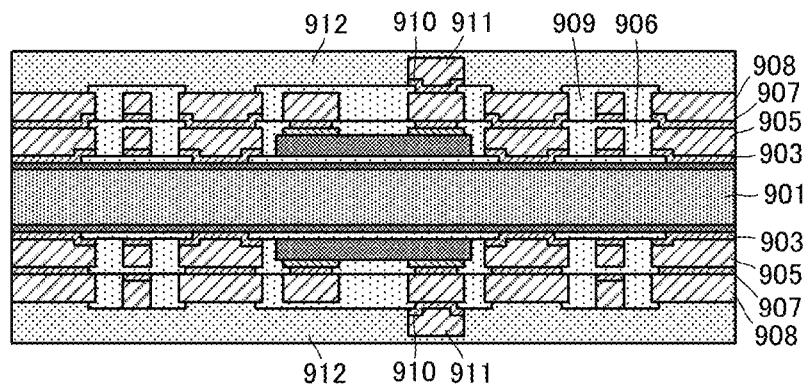
FIGS. 6(A) to 6(D) are each a side sectional view showing a structure in a manufacturing step of the LC device according to an exemplary embodiment.

As shown in FIG. 6(A), each protective film 912 is mounted so as to cover the corresponding conductor layer 911, the corresponding seed layer 910, and the corresponding resin layer 909 and so as to fill the corresponding recessed portion 909H.

Figure 6B:
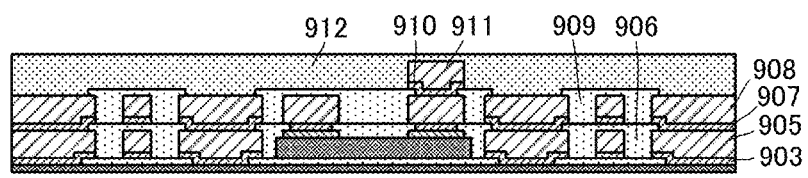

As shown in FIG. 6(B), by using the peeling layers, the portion that becomes the LC device 10 is peeled off from the base board 901.

Figure 6C:
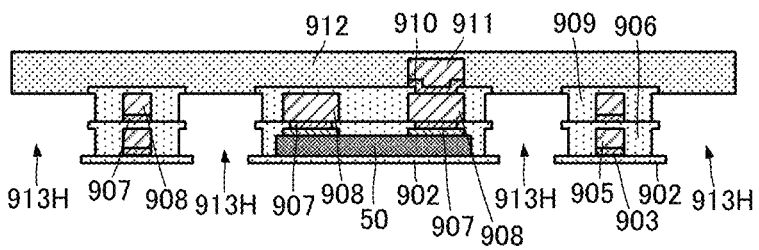

As shown in FIG. 6(C), the seed layer 903, the magnetic-path-formation sacrificial layer 905, the seed layer 907, and the magnetic-path-formation sacrificial layer 908 are laminated in that order, and portions that are not covered by the base resin layer 902 are etched to remove the seed layer 903, the magnetic-path-formation sacrificial layer 905, the seed layer 907, and the magnetic-path-formation sacrificial layer 908. By this, holes 913H such as those shown in FIG. 6(C) are formed at portions that later become the magnetic body portions 31 and 32.

Figure 6D:
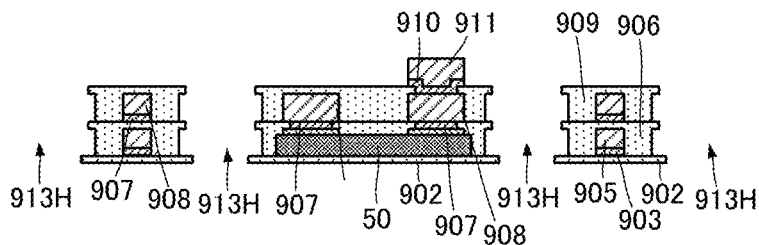

As shown in FIG. 6(D), the protective film 912 is peeled off.

Figure 7A:
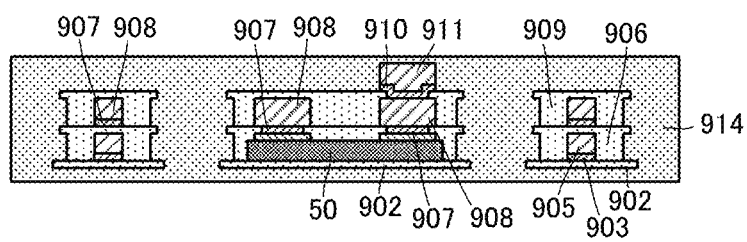
FIGS. 7(A) to 7(C) are each a side sectional view showing a structure in a manufacturing step of the LC device according to an exemplary embodiment.

As shown in FIG. 7(A), a magnetic material 914 is formed so as to cover the entire surface on the side of the base resin layer 902 and the entire surface on the side of the conductor layer 911 and to fill the holes 913H in FIG. 6(D).

Figure 7B:
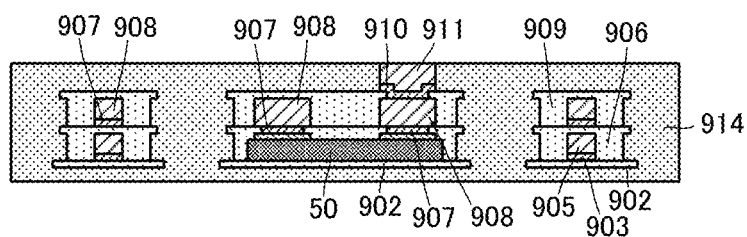

As shown in FIG. 7(B), the magnetic material 914 on the side of the conductor layer 911 is ground until the conductor layer 911 is exposed.

Figure 7C:
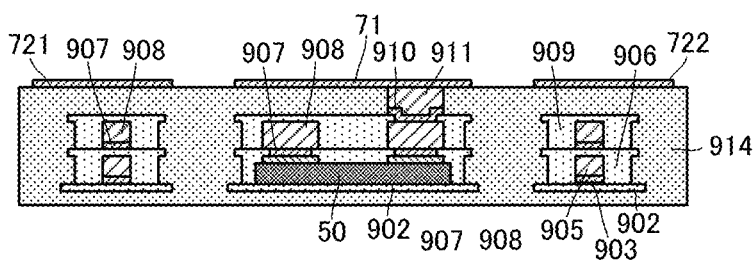

As shown in FIG. 7(C), the ground terminal conductor 71 and the input/output terminal conductors 721 and 722 are formed on a surface of the magnetic material 914 on the side of the conductor layer 911.

By using such a manufacturing method, it is possible to manufacture the LC device 10. In addition, by using this manufacturing method, it is possible to form portions that become LC devices 10 on both surfaces of the base board, thereby increasing manufacturing efficiency.

By forming the portions that become the magnetic-path-formation sacrificial layer, the conductor pattern, and the wiring conductor out of the same material, part of the step of forming the magnetic body portions 31 and 32 can be performed at the same time as the step of forming the conductor patterns 401, 402, 611, and 621 and the wiring conductors 61 and 62. This makes it possible to simplify the manufacturing step.

Figure 8A:
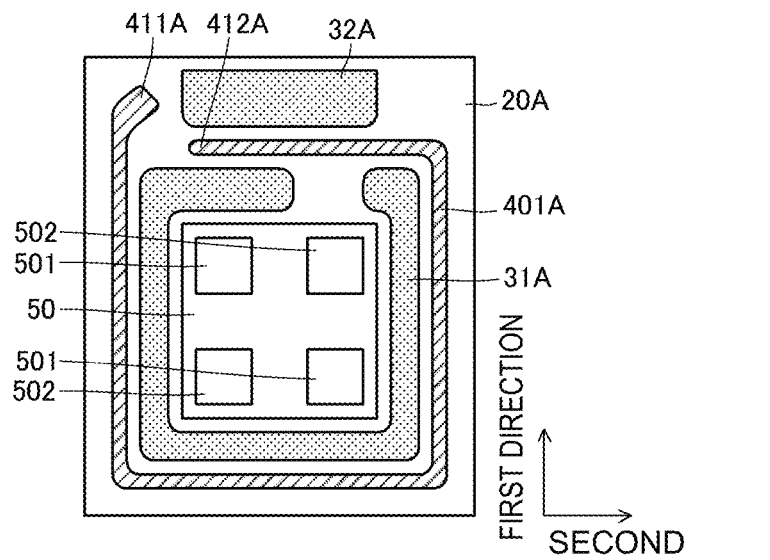
FIGS. 8(A), 8(B), and 8(C) each show a schematic layered structure of an LC device according to a second exemplary embodiment.
Figure 8B:
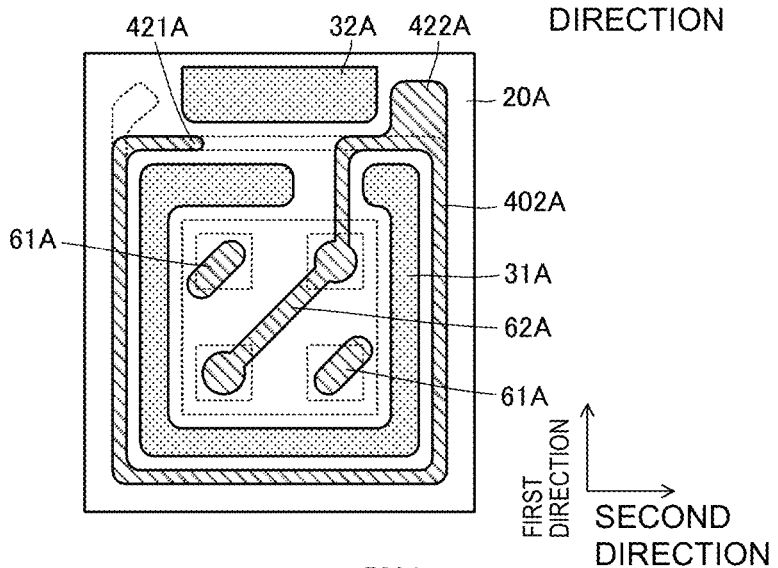
Figure 8C:
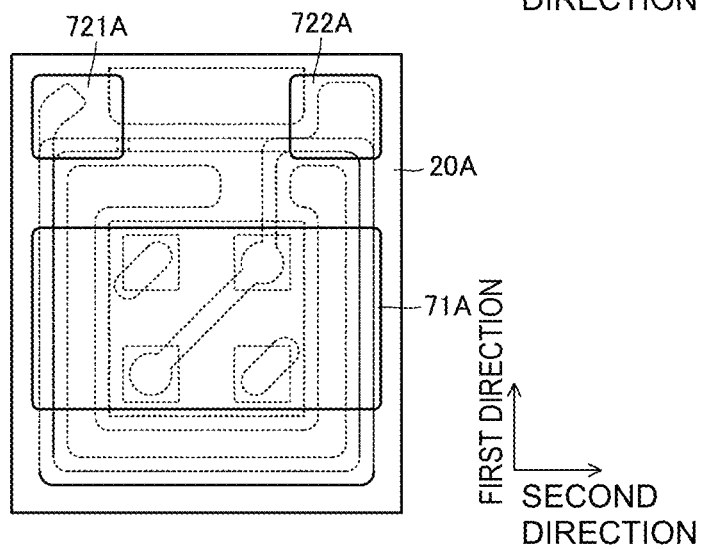
Figure 9A:
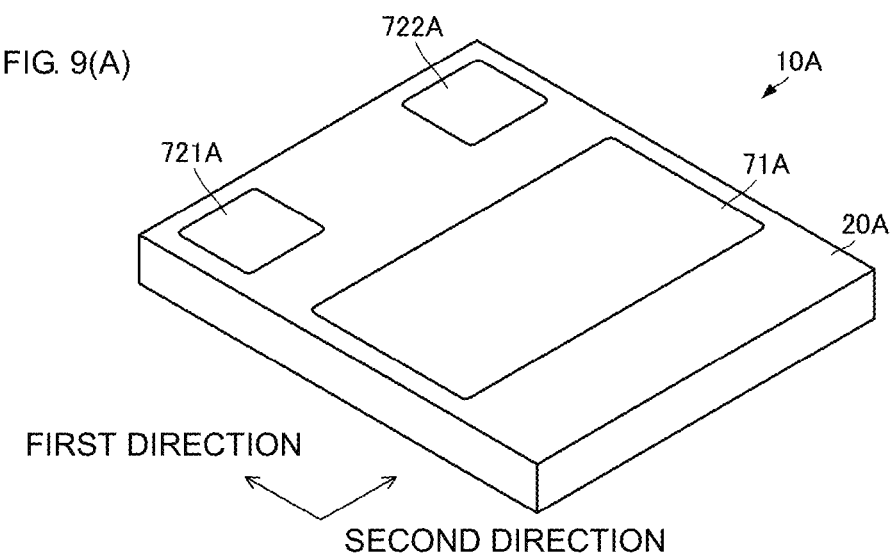
FIG. 9(A) is an external perspective view of the LC device according to the second exemplary embodiment as viewed from the side of a first principal surface.
Figure 9B:
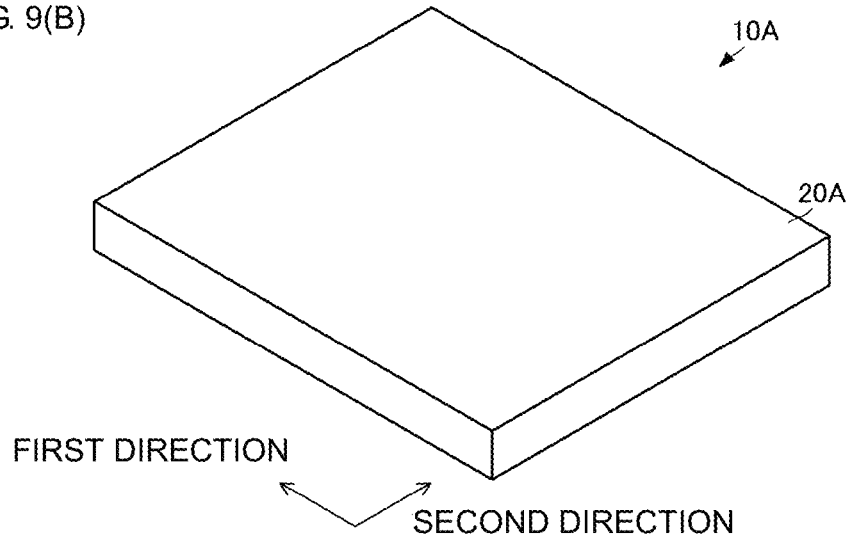
FIG. 9(B) is an external perspective view of the LC device according to the second exemplary embodiment as viewed from the side of a second principal surface.

Next, an LC device according to a second embodiment is described with reference to the drawings. FIGS. 8(A), 8(B), and 8(C) each show a schematic layered structure of the LC device according to the second embodiment. FIG. 9(A) is an external perspective view of the LC device according to the second embodiment as viewed from the side of a first principal surface. FIG. 9(B) is an external perspective view of the LC device according to the second embodiment as viewed from the side of a second principal surface.

As shown in FIGS. 8(A), 8(B), and 8(C) and FIGS. 9(A) and 9(B), compared to the LC device 10 according to the first embodiment, the LC device 10A according to the second embodiment has the same basic structure, and differs in portions such as where a magnetic body portion on an outer side of loop-shaped conductor patterns is partly disposed. Therefore, the descriptions of the portions having the same structures as those in the LC device 10 of the first embodiment are not given, and only the portions that need to be described are specifically described.

According to the exemplary embodiment, the LC device 10A has a planar shape, and includes a ground terminal conductor 71A and input/output terminal conductors 721A and 722A on a first principal surface. The ground terminal conductor 71A and the input/output terminal conductors 721A and 722A are substantially rectangular in plan view. The ground terminal conductor 71A is formed near the center of the LC device 10 in a first direction, and has a shape extending over the entire length in a second direction. The input/output terminal conductors 721A and 722A are formed near one end of the LC device 10 in the first direction. The input/output terminal conductor 721A is disposed near one end in the second direction, and the input/output terminal conductor 722A is disposed near the other end in the second direction.

Moreover, conductor patterns 401A and 402A have loop shapes, and are disposed at positions that substantially overlap each other in plan view of an element 20A, that is, in a direction perpendicular to the first direction and the second direction. The conductor patterns 401A and 402A are disposed along four side surfaces of the element 20A, and are disposed near three of the four side surfaces excluding the side surface at the one end in the first direction.

The conductor pattern 401A is disposed on a second-principal-surface side of the conductor pattern 402A. One end 411A in a direction of extension of the conductor pattern 401A overlaps the input/output terminal conductor 721A in the plan view. The one end 411A is connected to the input/output terminal conductor 721A by a via conductor.

In the plan view, one end 421A (i.e., a first end) in a direction of extension of the conductor pattern 402A overlaps the other end 412A (i.e., a second end) in the direction of extension of the conductor pattern 401A. The one end 421A of the conductor pattern 402A is connected to the other end of the conductor pattern 401A by a via conductor. In the plan view, the other end 422A in the direction of extension of the conductor pattern 402A overlaps the input/output terminal conductor 722A. The other end 422A is connected to the input/output terminal conductor 722A by a via conductor. Due to this structure, an inductor including the conductor patterns 401A and 402A has a spiral shape including a winding axis parallel to a thickness direction of the element 20A and having an opening in the center in the plan view.

In the thickness direction of the element 20A, a magnetic body portion 31A has a predetermined length so as to include a layer where the conductor pattern 401A is formed and a layer where the conductor pattern 402A is formed. That is, in side view of the element 20A, the magnetic body portion 31A is disposed so as to exist in the same thickness positions as the conductor patterns 401A and 402A. The magnetic body portion 31A has a substantially ring shape in the plan view, and is disposed substantially parallel to the directions of extensions of the conductor patterns 401A and 402A. The magnetic body portion 31A is disposed on an opening side of the conductor patterns 401A and 402A, that is, on an inner side of the conductor patterns 401A and 402A in the plan view of the element 20A. The magnetic body portion 31A has a shape that is partly cut at a portion thereof in a direction of extension of the substantially ring shape. The cut portion is a portion in the magnetic body portion 31A that is parallel to the second direction and that is disposed on a near side of the other end in the first direction. More specifically, in the plan view of the element 20A, the cut portion is disposed between a region where the input/output terminal conductor 722A is formed and a region where a capacitor 50 (described later) is disposed.

Similarly to the magnetic body portion 31A, in the thickness direction of the element 20A, a magnetic body portion 32A has a predetermined length so as to include the layer where the conductor pattern 401A is formed and the layer where the conductor pattern 402A is formed. The magnetic body portion 32A is disposed between a side surface at the other end in the first direction and the conductor patterns 401 and 402. That is, the magnetic body portion 32A is disposed near a portion including the cut portion of the magnetic body portion 31A.

As further shown, the capacitor 50 is disposed in an opening of the substantially ring-shaped magnetic body portion 31A. The capacitor 50 includes a plurality of first external terminal conductors 501 and a plurality of second external terminal conductors 502. The capacitor 50 is disposed such that a surface where the plurality of first external terminal conductors 501 and the plurality of second external terminal conductors 502 are provided is a first-principal-surface side. The plurality of first external terminal conductors 501 are each disposed on a first diagonal of the capacitor 50, and the plurality of second external terminal conductors 502 are each disposed on a second diagonal of the capacitor 50.

Wiring conductors 61A and 62A are formed in the same layer as the conductor pattern 402A. In the plan view of the element 20A, the wiring conductors 61A overlap the first external terminal conductors 501, and are connected by via conductors. Further, in the plan view of the element 20A, the wiring conductors 61A overlap the ground terminal conductor 71A, and are connected by via conductors. Due to this structure, the capacitor 50 is connected to the ground terminal conductor 71A by only the conductors that extend in the thickness direction of the element 20A, and advantageously can suppress parasitic inductance between the capacitor 50 and the ground terminal conductor 71A.

In the plan view, the wiring conductor 62A overlaps the second external terminal conductors 502, and is connected by a via conductor. The wiring conductor 62A extends through the cut portion of a magnetic body 31A, and is connected to the other end 422A of the conductor pattern 402A.

By having such a structure described above, similarly to the LC device 10, the LC device 10A can realize a circuit shown in FIG. 2. Similarly to the LC device 10, the LC device 10A can suppress a reduction in the Q value of the inductor.

The LC device 10A does not include magnetic body portions in three directions on the outer sides of the conductor patterns 401A and 402A that make up the inductor (both ends in the first direction and one end in the second direction). By this, if the size of the element is prescribed, within the range of this size, the opening of the inductor can be made large, and the characteristics of the inductor are improved. On the other hand, if the opening of the inductor is prescribed, the element can be made small.

In the LC device 10A, in the plan view of the element 20A, the wiring conductor 62A does not overlap the magnetic body portion 31A. By this, coupling between the wiring conductor 62A and the magnetic body portion 31A is suppressed, and parasitic inductance and loss between the capacitor 50 and the input/output terminal conductor 722A, that is, on a signal line side of the capacitor 50 can be reduced.

In the LC device 10A, there are a plurality of first external terminal conductors 501 and a plurality of second external terminal conductors 502 of the capacitor 50. This reduces ESL of the capacitor, and can reduce loss. This is, in particular, effective in a case in which the LC device 10A is used in a power line, and is particularly effective when the Q value of the inductance is high as in the LC device 10A.

Figure 10:
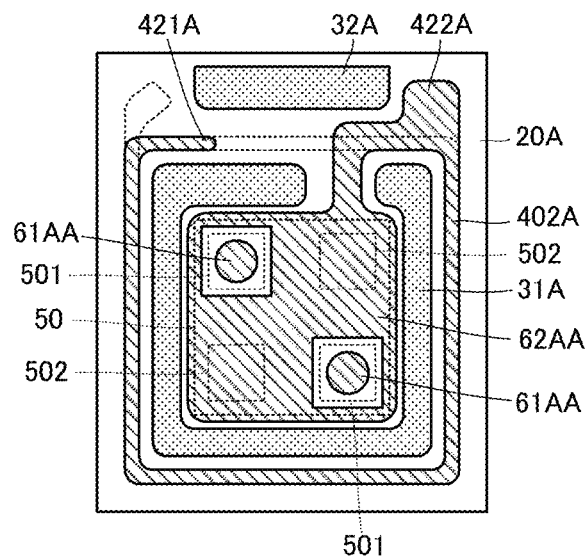
FIG. 10 is a diagram showing a derived example of wiring conductors provided at a capacitor of the LC device according to the second exemplary embodiment.

It is noted that, as shown in FIG. 10, the wiring conductors 61A and 62A may be replaced by wiring conductors 61AA and 62AA. FIG. 10 is a diagram showing a derived example of the wiring conductors provided at the capacitor of the LC device according to the second embodiment.

As shown in FIG. 10, the wiring conductors 61AA each have a shape that overlaps the corresponding first external terminal conductor 501 of the capacitor 50. The wiring conductor 62AA has a shape that overlaps substantially the entire surface of the capacitor 50 excluding the first external terminal conductors 501.

Due to such a structure, the area of the wiring conductor 62AA is increased, and the resistance is reduced. Further, the width of a portion of the wiring conductor 62AA that extends through the cut portion of the magnetic body portion 31A is also large. This further reduces the resistance of the wiring conductor 62AA. Therefore, parasitic inductance on the signal line side (the side of the input/output terminal conductor 722A) of the capacitor 50 can be reduced and loss can be reduced, so that the characteristics of the LC device 10A are improved.

Figure 11:
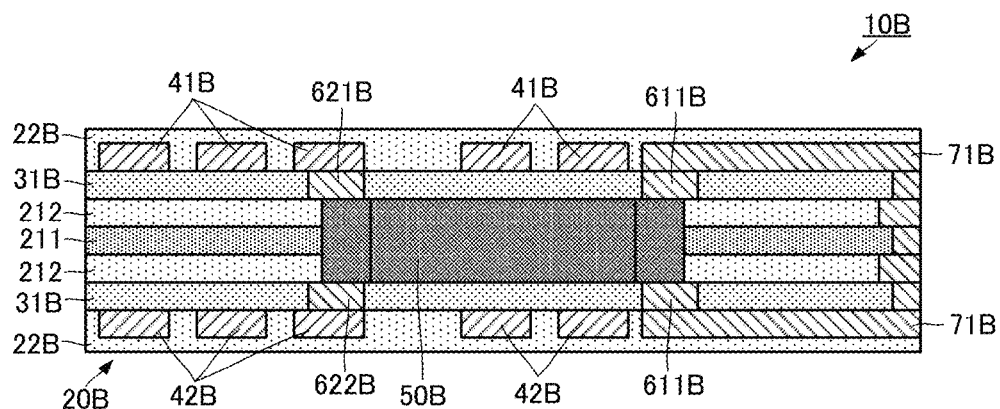
FIG. 11 is a structural view showing a configuration of an LC device according to a third exemplary embodiment as viewed from a side surface thereof.

Next, an LC device according to a third embodiment is described with reference to the drawings. FIG. 11 is a structural view of a configuration of the LC device according to the third embodiment as viewed from a side surface thereof.

As shown in FIG. 11, the LC device 10B according to the third embodiment differs from the LC device 10 according to the first embodiment and the LC device 10A according to the second embodiment in a capacitor 50B that is used. The capacitor 50B has a configuration including external terminal conductors on both ends of a dielectric element that generates capacitance by using a known internal configuration.

The LC device 10B includes an element 20B. The element 20B is a multilayer body including planar resin portions 211, 212, 22B, and magnetic body portions 31B. The resin portions 212 are disposed on two respective principal surfaces of the resin portion 211. The magnetic body portions 31B are each disposed on a surface of the corresponding resin portion 212 on a side opposite to a contact surface with the resin portion 211. The resin portions 22B are each disposed on a surface of the corresponding magnetic body portion 31B on a side opposite to the resin portion 212.

The capacitor 50B is disposed in a layer of the resin portion 211 and layers of the resin portions 212. Conductor patterns 41B and 42B have spiral shapes in plan view. By this, an inductor is formed.

The conductor pattern 41B is disposed on one end side of the capacitor 50B in a thickness direction of the element 20B. The conductor pattern 42B is disposed on the other end side of the capacitor 50B in the thickness direction of the element 20B. The conductor patterns 41B and 42B are formed inside the corresponding resin portions 22B so as to be in contact with the corresponding magnetic body portions 31B. The conductor pattern 41B is connected to one of the external terminal conductors of the capacitor by a conductor pattern 621B formed at the magnetic body portion 31B on the one end side of the capacitor 50B. The conductor pattern 42B is connected to the one of the external terminal conductors of the capacitor by a conductor pattern 622B formed at the magnetic body portion 31B on the other end side of the capacitor 50B.

Wiring conductors 71B are each formed in the same layer as the conductor pattern 41B or the conductor pattern 42B. The wiring conductors 71B are each connected to the other external terminal conductor of the capacitor by a corresponding one of the conductor patterns 611B formed at the corresponding magnetic body portion 31B. Two wiring conductors 71B are connected by a connecting conductor extending in the thickness direction.

The LC device 10B having the above-described structure can be manufactured by a known method of manufacturing a component built-in type multilayer board.

Figure 12:
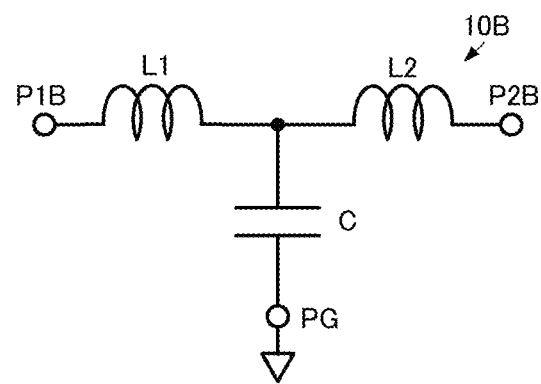
FIG. 12 is an equivalent circuit diagram of the LC device according to the third exemplary embodiment.

Due to such a structure, the LC device 10B can realize a circuit shown in FIG. 12. FIG. 12 is an equivalent circuit diagram of the LC device according to the third embodiment.

As shown in FIG. 12, the LC device 10B includes, in terms of a circuit, input/output terminals P1B and P2B, a ground terminal PG, inductors L1 and L2, and a capacitor C.

One end of the inductor L1 is connected to the input/output terminal P1B, and the other end of the inductor L1 is connected to one end of the inductor L2 and one end of the capacitor C. The other end of the inductor L2 is connected to the input/output terminal P2B. That is, the inductors L1 and L2 are connected in series with a signal line that connects the input/output terminals P1B and P2B. The other end of the capacitor is connected to the ground terminal PG The ground terminal PG is connected to, for example, a reference potential or ground.

The inductor L1 is realized by the conductor pattern 41B, and the inductor L2 is realized by the conductor pattern 42B. The capacitor C is realized by the capacitor 50.

The input/output terminal P1B is an end portion of the conductor pattern 41B on a side opposite to the side that is connected to the capacitor 50. The input/output terminal P2B is an end portion of the conductor pattern 42B on a side opposite to the side that is connected to the capacitor 50. The ground terminal PG is an end portion of the wiring conductor 71B on a side opposite to the side that is connected to the capacitor 50.

In the structure of the above-described LC device 10B, the magnetic body portions 31B are each disposed between the conductor pattern 41B that makes up the inductor and the capacitor 50B or between the conductor pattern 42B that makes up the inductor and the capacitor 50B. Similarly to the above-described embodiment, this makes it possible to suppress a reduction in the Q value of the inductor. In addition, this makes it possible to suppress a reduction in the characteristics of the capacitor 50B.

Figure 13:
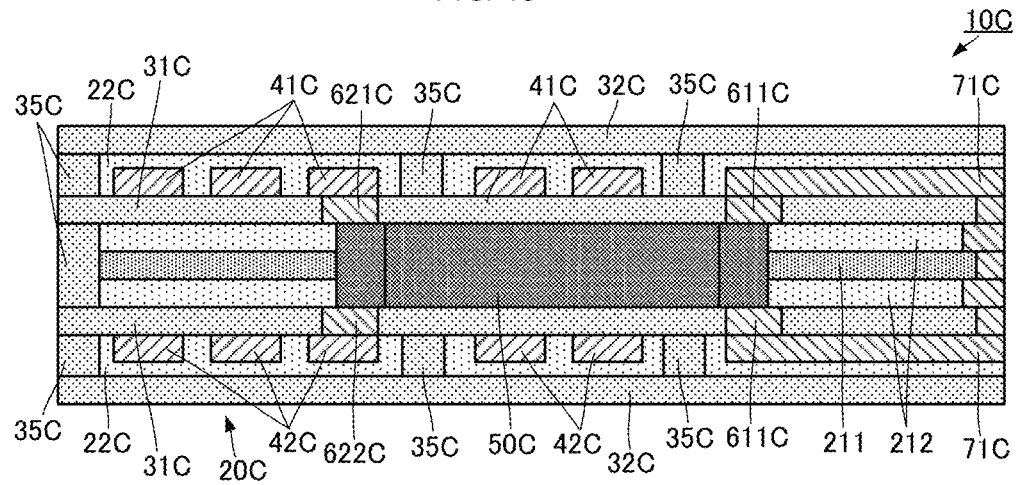
FIG. 13 is a structural view showing a configuration of an LC device according to a fourth exemplary embodiment as viewed from a side surface thereof.

Next, an LC device according to a fourth embodiment is described with reference to the drawings. FIG. 13 is a structural view showing a configuration of the LC device according to the fourth embodiment as viewed from a side surface thereof.

As shown in FIG. 13, the LC device 10C according to the fourth embodiment differs from the LC device 10B according to the third embodiment in that magnetic body portions 32C and 35C are added. The other structures of the LC device 10C are the same as those of the LC device 10B, and descriptions of similar portions are not given.

Resin portions 22C, magnetic body portions 31C, conductor patterns 41C and 42C, a capacitor 50C, conductor patterns 611C, 621C, and 622C, and wiring conductors 71C of the LC device 10C are similar to the resin portions 22B, the magnetic body portions 31B, the conductor patterns 41B and 42B, the capacitor 50B, and the conductor patterns 611B, 621B, and 622B of the LC device 10B.

The magnetic body portions 32C have a planar shape, and are each disposed on a side opposite to the magnetic body portion 31C with respect to the resin portion 22C. The magnetic body portions 35C are connected to the magnetic body portions 31C and 32C. The magnetic body portions 31C, 32C, and 35C surround the conductor patterns 41C and 42C.

Due to such a structure, magnetic fields that are generated by the conductor patterns 41C and 42C pass inside a closed magnetic path formed by the magnetic body portions 31C, 32C, and 35C, and there is almost no leakage of the magnetic fields to the outside of the closed magnetic path (side opposite to the conductor patterns 41C and 42C). This makes it possible suppress a reduction in the Q value of the inductor including the conductor patterns 41C and 42C.

Figure 14A:
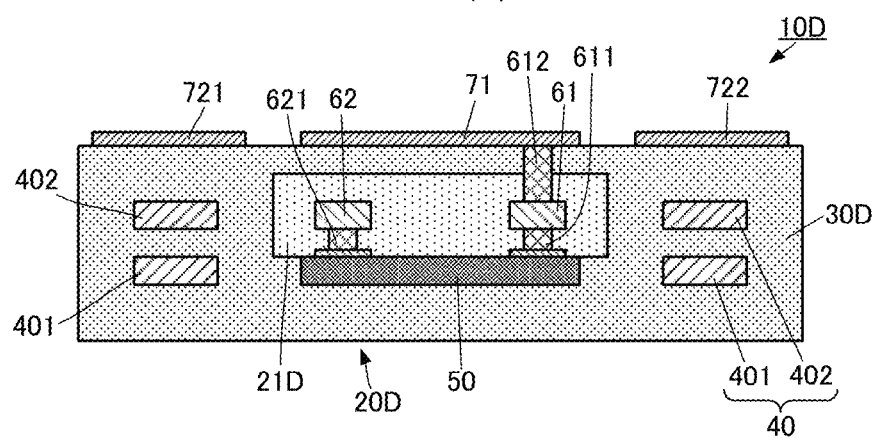
FIGS. 14(A) and 14(B) are each a structural view showing a configuration of an LC device according to a fifth exemplary embodiment as viewed from a side surface thereof.
Figure 14B:
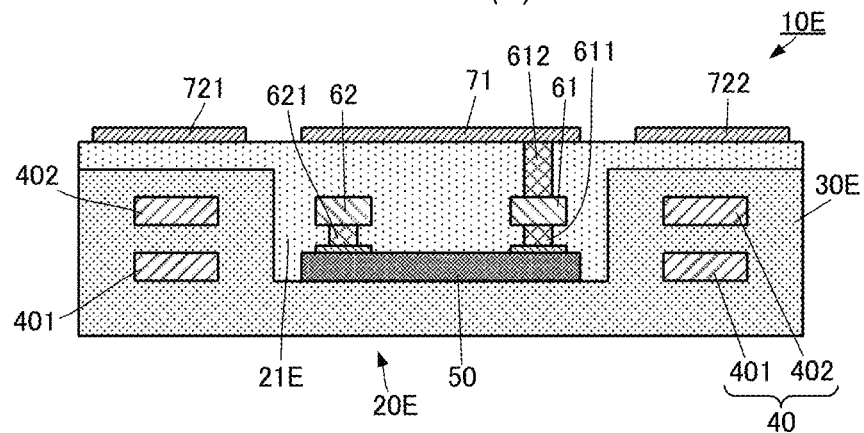

Next, an LC device according to a fifth embodiment is described with reference to the drawings. FIGS. 14(A) and 14(B) are each a structural view showing a configuration of the LC device according to the fifth embodiment as viewed from a side surface thereof.

The LC device 10D shown in FIG. 14(A) has substantially the same configuration as the LC device 10 according to the first embodiment, and differs therefrom in the shapes of a resin portion 21D and a magnetic body portion 30D of an element 20D.

As shown in FIG. 14(A), the resin portion 21D is disposed only at a portion of the element 20D on a side of a surface of the capacitor 50 where external terminal conductors are formed (a portion where wiring conductors 61 and 62 and conductor patterns 611 and 621 are formed). The other portions of the element 20D are formed by the magnetic body portion 30D. Even with such a structure, it is possible to obtain operation effects similar to those obtained by the LC device 10 according to the first embodiment.

An LC device 10E shown in FIG. 14(B) has the substantially the same structure as the LC device 10 according to the first embodiment, and differs therefrom in the shapes of a resin portion 21E and a magnetic body portion 30E of an element 20E.

As shown in FIG. 14(B), the resin portion 21E is formed on a portion of the element 20E on a side of a surface where external terminal conductors of a capacitor 50 are formed (a portion where wiring conductors 61 and 62 and conductor patterns 611 and 621 are formed), a side surface of the capacitor 50, and a surface of the element 20E where a ground terminal conductor 71 and input/output terminal conductors 721 and 722 are formed. Even with such a structure, it is possible to obtain operation effects similar to those obtained by the LC device 10 according to the first embodiment. In this structure, even if the ground terminal conductor 71 and the input/output terminal conductors 721 and 722 are close to each other, it is possible to more reliably suppress a short circuit therebetween.

It is noted that these structures of the exemplary embodiments are provided as examples. Thus, in an exemplary embodiment, the LC device includes an element including a resin portion and a magnetic body portion. The capacitor of a mounting type and a loop-shaped conductor pattern making up the inductor are provided inside the element. The magnetic body portion is disposed between the capacitor and the loop-shaped conductor pattern.

Although, in the above-described description, a mode in which metal particles are used as the magnetic body portions is described, other magnetic body materials, such ferrite powder, may be used. However, by using metal particles, the DC superimposition characteristics of the inductor are improved, and an LC device suitable for large current applications (for example, a power supply circuit) can be obtained.

Although, in the above-described first and second embodiments, the loop-shaped conductor patterns have one turn of wire in each layer, they may have a plurality of turns of wire in each layer. Further, although, in the above-described first and second embodiments, a mode in which two layers of loop-shaped conductor patterns are formed is described, the number of layers may be one or three or more.

REFERENCE SIGNS LIST

P1: INPUT/OUTPUT TERMINAL
P1B: INPUT/OUTPUT TERMINAL
P2: INPUT/OUTPUT TERMINAL
P2B: INPUT/OUTPUT TERMINAL
PG: GROUND TERMINAL
10, 10A, 10B, 10C, 10D, 10E: LC DEVICE
20, 20A, 20B, 20D, 20E: ELEMENT
21, 21D, 21E, 22, 22B, 22C: RESIN
30D, 30E, 31, 31A, 31B, 31C, 32, 32A, 32C, 33, 34, 35C: MAGNETIC BODY PORTION
40: INDUCTOR
41B, 42B, 41C, 42C: CONDUCTOR PATTERN
50, 50B, 50C: CAPACITOR
61, 61A, 61AA, 62, 62A, 62AA: WIRING CONDUCTOR
71, 71A: GROUND TERMINAL CONDUCTOR
71B, 71C: WIRING CONDUCTOR
201: FIRST PRINCIPAL SURFACE
202: SECOND PRINCIPAL SURFACE
203: SIDE SURFACE
211, 212: RESIN PORTION
401, 401A, 402, 402A: CONDUCTOR PATTERN
411A: ONE END OF CONDUCTOR PATTERN 401A
412A: OTHER END OF CONDUCTOR PATTERN 401A
421A: ONE END OF CONDUCTOR PATTERN 402A
422A: OTHER END OF CONDUCTOR PATTERN 402A
501: FIRST EXTERNAL TERMINAL CONDUCTOR
502: SECOND EXTERNAL TERMINAL CONDUCTOR
611, 611B, 611C, 612, 621, 621B, 622B: CONDUCTOR PATTERN
721, 721A, 722, 722A: INPUT/OUTPUT TERMINAL CONDUCTOR
901: BASE BOARD
902: BASE RESIN LAYER
902H: MAGNETIC-PATH-FORMATION THROUGH HOLE
903, 907, 910: SEED LAYER
904: RESIST PATTERN
904H, 906H, 908H, 909H: RECESSED PORTION
905, 908: MAGNETIC-PATH-FORMATION SACRIFICIAL LAYER
906, 909: RESIN LAYER
911: CONDUCTOR LAYER
912: PROTECTIVE FILM
913H: HOLE
914: MAGNETIC MATERIAL

The invention claimed is:
1. An LC device comprising:

a planar element having first and second principal surfaces that oppose each other with an insulating resin layer disposed between at least a portion of the first and second principal surfaces;
an inductor disposed inside the planar element and including a loop-shaped conductor pattern in a plan view from the first principal surface;
a mounting-type capacitor disposed in an opening of the loop-shaped conductor pattern in the plan view and inside the planar element with at least a mounting surface of the capacitor in contact with the insulating resin layer; and
a first magnetic-body that forms a portion of the planar element and that is disposed between the loop-shaped conductor pattern of the inductor and the mounting-type capacitor over an entire length of the loop-shaped conductor pattern.

2. The LC device according to claim 1, further comprising a second magnetic-body disposed at at least a part of the loop-shaped conductor pattern on a side opposite to the first magnetic-body.

3. The LC device according to claim 2, wherein the second magnetic-body faces the first magnetic-body over the entire length of the loop-shaped conductor pattern.

4. The LC device according to claim 2, further comprising at least one third magnetic-body disposed on a first side of the loop-shaped conductor pattern and a fourth magnetic-body disposed on a second side of the loop-shaped conductor pattern that opposes the first side.

5. The LC device according to claim 4, wherein the first magnetic-body, the second magnetic-body, the third magnetic-body, and the fourth magnetic-body are connected to each other in a shape that surrounds the loop-shaped conductor pattern.

6. The LC device according to claim 5, wherein each of the first magnetic-body, the second magnetic-body, the third magnetic-body, and the fourth magnetic-body comprise a metal composite material.

7. The LC device according to claim 1,
wherein the capacitor includes a first external terminal conductor and a second external terminal conductor,
wherein a first input/output terminal conductor, a second input/output terminal conductor, and a ground terminal conductor are disposed on the first principal surface of the planar element,
wherein the first input/output terminal conductor is connected to a first end of the inductor,
wherein a second end of the inductor is connected to the second input/output terminal conductor and the first external terminal conductor of the capacitor, and
wherein the second external terminal conductor of the capacitor is connected to the ground terminal conductor.

8. The LC device according to claim 7, wherein a wiring conductor that connects the second end of the inductor to the first external terminal conductor comprises a width that is larger than a width of the loop-shaped conductor pattern forming the inductor.

9. The LC device according to claim 7, wherein the second external terminal conductor is disposed on a side of a first principal surface of a body of the capacitor.

10. The LC device according to claim 9, wherein the second external terminal conductor and the ground terminal conductor at least partly overlap each other and are only connected to each other by a conductor extending in a thickness direction of the planar element.

11. An LC device comprising:
a mounting-type capacitor with insulating resin layer surrounding the mounting-type capacitor in a plan view of the LC device;
an inductor having a loop-shaped conductor pattern that surrounds the mounting-type capacitor in the plan view of the LC device; and
a first magnetic-body extending in a direction normal to the plan view of the LC device and disposed between the loop-shaped conductor pattern of the inductor and the mounting-type capacitor.

12. The LC device according to claim 11, wherein the first magnetic-body is disposed between the loop-shaped conductor pattern and the mounting-type capacitor over an entire length of the loop-shaped conductor pattern.

13. The LC device according to claim 11, further comprising a second magnetic-body disposed on a side opposite of the loop-shaped conductor pattern opposite to the first magnetic-body.

14. The LC device according to claim 13, further comprising a third magnetic-body disposed on a top side of the loop-shaped conductor pattern in the plan view and a fourth magnetic-body disposed on a bottom side of the loop-shaped conductor pattern in the plan view that opposes the first side.

15. The LC device according to claim 14, wherein the first magnetic-body, the second magnetic-body, the third magnetic-body, and the fourth magnetic-body are connected to each other in a shape that surrounds the loop-shaped conductor pattern.

16. The LC device according to claim 15, wherein each of the first magnetic-body, the second magnetic-body, the third magnetic-body, and the fourth magnetic-body comprise a metal composite material.

17. The LC device according to claim 11, further comprising:
a planar element having a first input/output terminal conductor, a second input/output terminal conductor, and a ground terminal conductor are disposed on a first principal surface of the planar element,
wherein the capacitor includes a first external terminal conductor and a second external terminal conductor,
wherein the first input/output terminal conductor is connected to a first end of the inductor,
wherein a second end of the inductor is connected to the second input/output terminal conductor and the first external terminal conductor of the capacitor, and
wherein the second external terminal conductor of the capacitor is connected to the ground terminal conductor.

18. The LC device according to claim 17, wherein a wiring conductor that connects the second end of the inductor to the first external terminal conductor comprises a width that is larger than a width of the loop-shaped conductor pattern forming the inductor.

19. The LC device according to claim 17, wherein the second external terminal conductor is disposed on a side of a first principal surface of a body of the capacitor.

20. The LC device according to claim 19, wherein the second external terminal conductor and the ground terminal conductor at least partly overlap each other and are only connected to each other by a conductor extending in a thickness direction of the planar element.

* * * * *